United States Patent
Nakata

(10) Patent No.: US 12,196,830 B2
(45) Date of Patent: Jan. 14, 2025

(54) IMAGE PROCESSING METHOD, IMAGE PROCESSING APPARATUS, AND COMPUTER-READABLE MEDIUM

(71) Applicant: Otoichi Nakata, Kanagawa (JP)

(72) Inventor: Otoichi Nakata, Kanagawa (JP)

(73) Assignee: RICOH COMPANY, LTD., Tokyo (JP)

( * ) Notice: Subject to any disclaimer, the term of this patent is extended or adjusted under 35 U.S.C. 154(b) by 374 days.

(21) Appl. No.: 17/870,866

(22) Filed: Jul. 22, 2022

(65) Prior Publication Data
US 2023/0034518 A1    Feb. 2, 2023

(30) Foreign Application Priority Data

Jul. 30, 2021 (JP) .................. 2021-125577

(51) Int. Cl.
| | | |
|---|---|---|
| G01R 33/56 | (2006.01) | |
| G06T 7/00 | (2017.01) | |
| G06V 10/20 | (2022.01) | |
| G06V 10/70 | (2022.01) | |

(52) U.S. Cl.
CPC ........ *G01R 33/5608* (2013.01); *G06T 7/0012* (2013.01); *G06V 10/255* (2022.01); *G06V 10/87* (2022.01); *G06T 2207/30016* (2013.01); *G06V 2201/031* (2022.01)

(58) Field of Classification Search
None
See application file for complete search history.

(56) References Cited

U.S. PATENT DOCUMENTS

| | | | | |
|---|---|---|---|---|
| 2008/0118132 | A1* | 5/2008 | Ubelhart | A61B 6/032 382/131 |
| 2018/0235713 | A1* | 8/2018 | Krimsky | G16H 50/50 |
| 2018/0325483 | A1 | 11/2018 | Shinohara et al. | |
| 2020/0294296 | A1 | 9/2020 | Yamagata et al. | |
| 2020/0297231 | A1 | 9/2020 | Yamagata et al. | |
| 2021/0158105 | A1* | 5/2021 | Machida | G06V 10/7784 |
| 2022/0399114 | A1* | 12/2022 | Foncubierta Rodriguez | G16H 10/40 |

FOREIGN PATENT DOCUMENTS

| | | |
|---|---|---|
| JP | 2006-167350 | 6/2006 |
| JP | 2018-153612 | 10/2018 |
| JP | 2020-146286 | 9/2020 |
| JP | 2020-151082 | 9/2020 |

* cited by examiner

*Primary Examiner* — Gabriel I Garcia
(74) *Attorney, Agent, or Firm* — XSENSUS LLP

(57) ABSTRACT

An image processing method includes: extracting a candidate modality image to be visualized from a data group of a single or a plurality of modality images; first associating separate modality data referring to an extracted modality image, with the extracted modality image; uniquely determining an image to be visualized, based on the modality image extracted at the extracting and an association result of the first associating; second associating different modality data being not associated at the first associating, with the modality image extracted at the extracting; and displaying the different modality data on the modality image extracted at the extracting.

8 Claims, 13 Drawing Sheets

| DISPLAY MODALITY ID | REFERENCE EXAMINATION NUMBER |
|---|---|
| 00001 | 3 |
| 00002 | 1 |
| ... | ... |
| 000xx | 1 |

FIG.11

| DISPLAY MODALITY ID | ANALYSIS TOTAL TIME POINT NUMBER | ANALYSIS TIME POINT NUMBER | RECORDED DATA ID |
|---|---|---|---|
| 00001 | 450 | 50 | A001 |
| | | 150 | A002 |
| | | 250 | B001 |
| 00002 | 1000 | 1000 | C001 |
| ... | ... | ... | ... |
| 000xx | 7 | 1 | D001 |
| | | 3 | D002 |
| | | 2 | D003 |
| | | 1 | D004 |

FIG.13

| DISPLAY MODALITY ID | REFERENCE DATA FILE NUMBER | ANALYSIS TOTAL TIME (INCLUDING ALL PROCESSES) | SIGNAL SOURCE ESTIMATION ANALYSIS TIME | PRESENCE OF SURFACE SHAPE OF CEREBRAL CORTEX | RECORDED DATA ID |
|---|---|---|---|---|---|
| 00001 | 3 | 6 MIN (11 MIN) | 1 MIN | ABSENT | A001 |
| | | | 2 MIN | ABSENT | A002 |
| | | | 3 MIN | PRESENT (5 MIN) | B001 |
| 00002 | 1 | 100 MIN (120 MIN) | 100 MIN | PRESENT (20MIN) | C001 |
| ... | ... | | ... | ... | ... |
| 000xx | 4 | 7 SEC (7 SEC) | 1 SEC | ABSENT | D001 |
| | | | 3 SEC | ABSENT | D002 |
| | | | 2 SEC | ABSENT | D003 |
| | | | 1 SEC | ABSENT | D004 |

FIG.15

| GROUP | EXAMINATION ID | CONDUCTOR MODEL | SIGNAL SOURCE ESTIMATION |
|---|---|---|---|
| A | Examination001 | SPHERICAL MODEL | DIPOLE ESTIMATION |
| | Examination002 | | |
| | Examination004 | | |
| | Examination006 | | |
| B | Examination003 | OVERLAP SPHERICAL MODEL | SPATIAL FILTERING METHOD |

IMAGE PROCESSING METHOD, IMAGE PROCESSING APPARATUS, AND COMPUTER-READABLE MEDIUM

CROSS-REFERENCE TO RELATED APPLICATIONS

The present application claims priority under 35 U.S.C. § 119 to Japanese Patent Application No. 2021-125577, filed on Jul. 30, 2021. The contents of which are incorporated herein by reference in their entirety.

BACKGROUND OF THE INVENTION

1. Field of the Invention

The present invention relates to an image processing method, an image processing apparatus, and a computer-readable medium

2. Description of the Related Art

In recent years, with improvement in performance of a computer and development of artificial intelligence, a technique of extracting an interval in which a characteristic waveform is present from a plurality of piece of recorded modality data (magnetoencephalography measurement data), performing dipole analysis in a cross-sectional manner, and detecting candidate epileptic spikes has been known.

Japanese Unexamined Patent Application Publication No. 2006-167350 discloses a technology for associating a positional relationship at the time of measuring brain's magnetic fields and a positional relationship at the time of measuring a magnetic resonance (MR) image.

However, according to the conventional technology, when pieces of positional information on dipoles of a plurality of pieces of modality data (magnetoencephalography measurement data) of a same subject are integrated and displayed in a single modality (MR image) and a dipole cluster is statistically analyzed, in some cases, a mismatch may occur between positional information that is needed to perform calculation for dipole estimation and positional information in the MR image, which is a problem.

SUMMARY OF THE INVENTION

According to an aspect of the present invention, an image processing method includes: extracting a candidate modality image to be visualized from a data group of a single or a plurality of modality images; first associating separate modality data referring to an extracted modality image, with the extracted modality image; uniquely determining an image to be visualized, based on the modality image extracted at the extracting and an association result of the first associating; second associating different modality data being not associated at the first associating, with the modality image extracted at the extracting; and displaying the different modality data on the modality image extracted at the extracting.

BRIEF DESCRIPTION OF THE DRAWINGS

FIG. 11 is a diagram illustrating an example of a statistical map;

FIG. 13 is a diagram illustrating an example of a statistical map according to a fourth embodiment;

FIG. 15 is a diagram illustrating an example of grouping performed by an analysis grouping unit.

The accompanying drawings are intended to depict exemplary embodiments of the present invention and should not be interpreted to limit the scope thereof. Identical or similar reference numerals designate identical or similar components throughout the various drawings.

DESCRIPTION OF THE EMBODIMENTS

Figure 1:
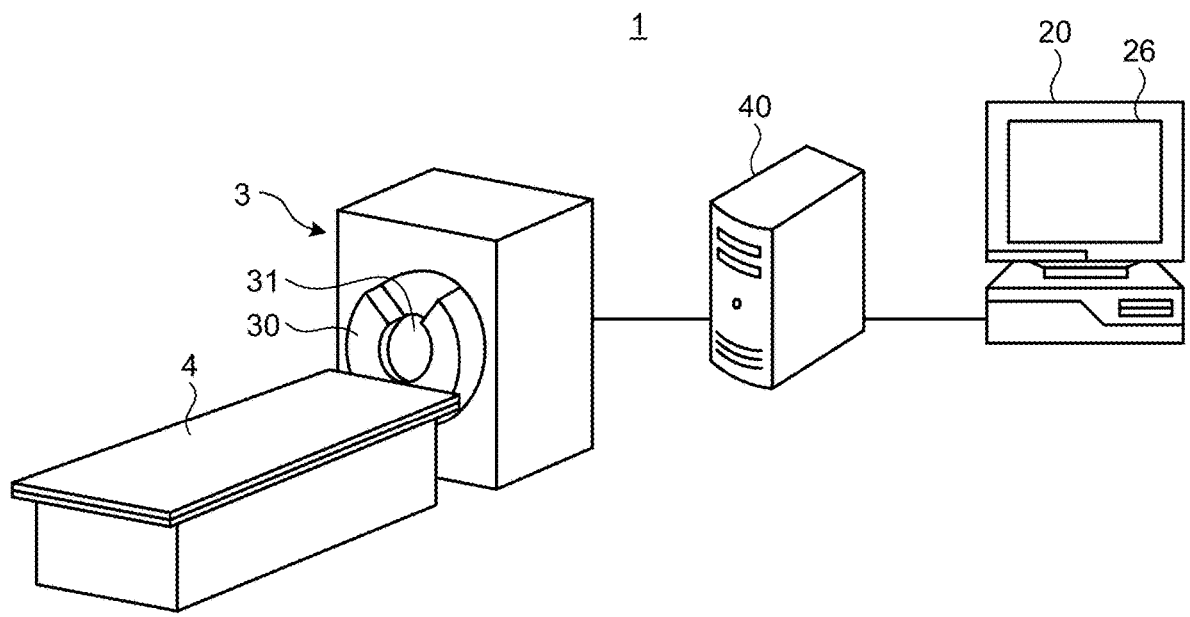
FIG. 1 is a diagram illustrating a configuration example of an information processing system according to a first embodiment.

The terminology used herein is for the purpose of describing particular embodiments only and is not intended to be limiting of the present invention.

As used herein, the singular forms "a", "an" and "the" are intended to include the plural forms as well, unless the context clearly indicates otherwise.

In describing preferred embodiments illustrated in the drawings, specific terminology may be employed for the sake of clarity. However, the disclosure of this patent specification is not intended to be limited to the specific terminology so selected, and it is to be understood that each specific element includes all technical equivalents that have the same function, operate in a similar manner, and achieve a similar result.

An embodiment of the present invention will be described in detail below with reference to the drawings.

An embodiment has an object to integrally display a plurality of pieces of modality data on a desired modality without a mismatch and at a high speed even in a situation in which the plurality of pieces of modality data are collectively input.

Embodiments of an image processing method, an image processing apparatus, and a computer-readable medium will be described in detail below with reference to the accompanying drawings.

First Embodiment

System Configuration

FIG. 1 is a diagram illustrating a configuration example of an information processing system 1 according to a first embodiment. In FIG. 1, the information processing system 1 measures and displays a plurality of kinds of biological signals, such as a magnetoencephalography (MEG) signal and an electroencephalography (EEG) signal. The information processing system 1 includes a measurement apparatus 3, a data recording server 40, and an information processing apparatus 20 that is an image processing apparatus. The information processing apparatus 20 includes a monitor display 26 that displays signal information (measurement information) that is obtained by measurement and an analysis result. In this example, the data recording server 40 and the information processing apparatus 20 are separately illustrated, but at least a part of the data recording server 40 may be incorporated in the information processing apparatus 20.

A measurement target person lies down on a measurement table 4 with face up while attaching electrodes (or sensors) for electroencephalography, and inserts a head portion in a hollow 31 of a dewar 30 of the measurement apparatus 3. The dewar 30 is a holding container in an extremely low temperature environment using liquid helium, and a large number of magnetic sensors for magnetoencephalography are arranged inside the hollow 31 of the dewar 30. The measurement apparatus 3 collects electroencephalography signals from the electrodes and magnetoencephalography signals from the magnetic sensors, and outputs the collected biological signals (measurement information) to the data recording server 40. The measurement information recorded in the data recording server 40 is read, displayed, and then analyzed by the information processing apparatus 20. In general, the dewar 30 in which the magnetic sensors are incorporated and the measurement table 4 are arranged in a magnetic shielding room, but illustration of the magnetic shielding room is omitted for the sake of convenience.

As described above, the measurement apparatus 3 is a biomagnetic measurement apparatus, such as a magnetoencephalography (MEG) measurement apparatus, and functions as a multi-channel measurement apparatus. In the measurement apparatus 3 as the multi-channel measurement apparatus, positions and orientations of the large number of magnetic sensors for magnetoencephalography are already known, and therefore, it is possible to calculate response values of the magnetic sensors when a signal source located close to a group of the magnetic sensors is supposedly determined.

The information processing apparatus 20 displays waveforms of magnetoencephalography signals from the plurality of magnetic sensors and waveforms of electroencephalography signals from the plurality of electrodes on the same time axis in a synchronous manner. The electroencephalography signal represents electrical activities of nerve cells (ion charge flow that occurs in dendrites of a neuron at the time of synaptic transmission) as a voltage value between the electrodes. The magnetoencephalography signal represents minute magnetic field variation that occurs due to electrical activities of a brain. The brain's magnetic fields are detected by a super-sensitive superconducting quantum interference device (SQUID) sensor.

Hardware Configuration

Figure 2:
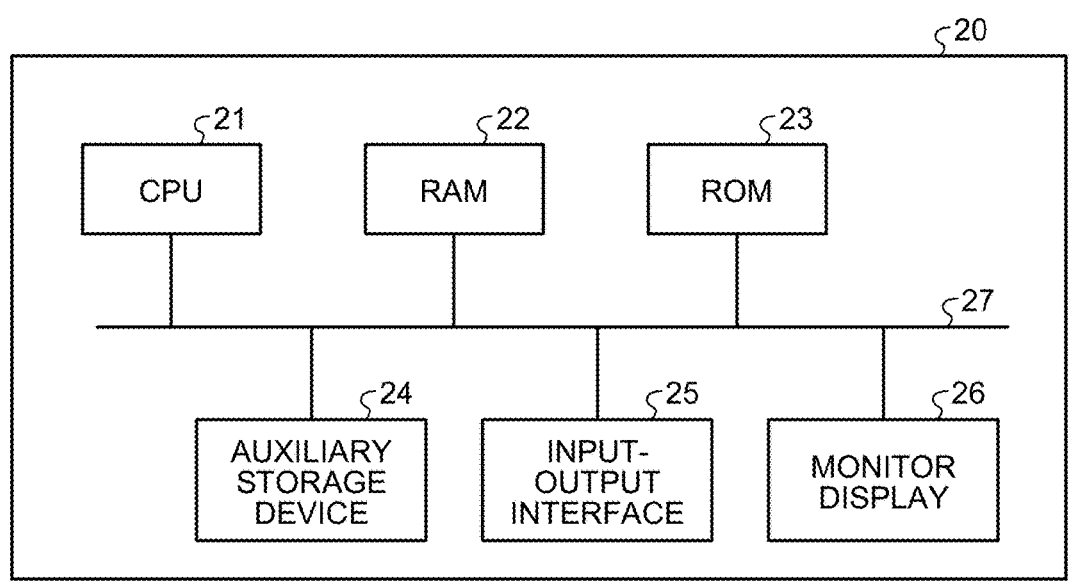
FIG. 2 is a block diagram illustrating an example of a hardware configuration of an information processing apparatus.

FIG. 2 is a block diagram illustrating an example of a hardware configuration of the information processing apparatus 20. The information processing apparatus 20 includes a central processing unit (CPU: a processor) 21, a random access memory (RAM) 22, a read only memory (ROM) 23, an auxiliary storage device 24, an input-output interface 25, and a monitor display (display device) 26. The CPU 21, the RAM 22, the ROM 23, the auxiliary storage device 24, the input-output interface 25, and the monitor display (display device) 26 are connected to one another via a bus 27.

The CPU 21 controls entire operation of the information processing apparatus 20, and performs various kinds of information processing. The CPU 21 executes an information processing program that is stored in the ROM 23 or the auxiliary storage device 24, and controls display operation of a measurement recording screen and an analysis screen.

The information processing program executed by the information processing apparatus 20 of the present embodiment is provided by being stored in a computer readable recording medium, such as a compact disc-ROM (CD-ROM), a flexible disk (FD), a CD-recordable (CD-R), or a digital versatile disk (DVD), in a computer-installable or computer-executable file format.

Furthermore, the information processing program executed by the information processing apparatus 20 of the present embodiment may be stored in a computer connected to a network, such as the Internet, and may be provided by download via the network. Moreover, the information processing program executed by the information processing apparatus 20 of the present embodiment may be provided or distributed via a network, such as the Internet.

Furthermore, the information processing program executed by the information processing apparatus 20 of the present embodiment may be provided by being incorporated in a ROM or the like in advance.

The RAM 22 is used as a work area for the CPU 21, and may include a non-volatile RAM for storing a main control parameter or information. The ROM 23 stores therein a basic input-output program or the like. The information processing program of the present invention may be stored in the ROM 23.

The auxiliary storage device 24 is a storage device, such as a solid state drive (SSD) or a hard disk drive (HDD), and stores therein, for example, the information processing program for controlling the operation of the information processing apparatus 20, various kinds of data, files, or the like needed for the operation of the information processing apparatus 20.

The input-output interface 25 includes a user interface, such as a touch panel, a keyboard, a display screen, or an operation button, and a transmission interface for receiving information from various sensors or the data recording server 40 and outputting analysis information to a different electronic device.

The monitor display 26 displays the measurement recording screen and the analysis screen, and the screens are updated in accordance with input-output operation that is performed via the input-output interface 25.

Functional Configuration

Functions of the information processing apparatus 20 according to the present embodiment will be described below.

Examination data that is input to the information processing apparatus 20 includes MR image measurement data (modality image) and magnetoencephalography measurement data (modality data for dipole analysis). The magnetoencephalography measurement data includes what is unique to the examination data without exception. However, the examination data may include only the magnetoencephalography measurement data (modality for dipole analysis). Further, an MR image that is already captured may be used for the MR image measurement data. Meanwhile, for simplicity of explanation, the modality image is referred to as an MR image in the explanation below, but, in the system, the modality image is not limited to the MR image, and a different modality image, such as CT or X-ray examination, is applicable in the same manner.

Figure 3:
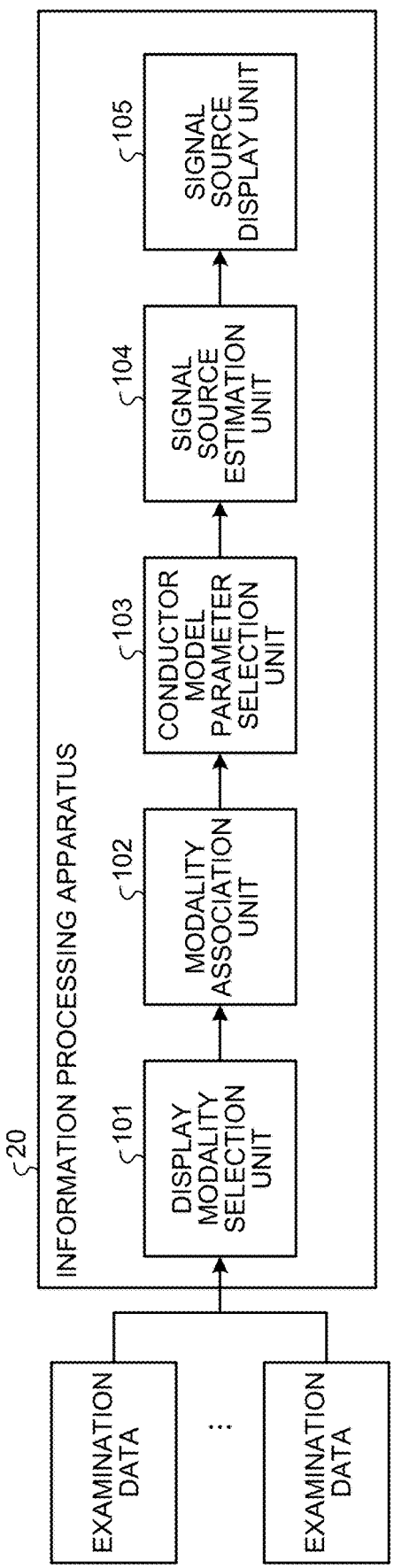
FIG. 3 is a block diagram illustrating a functional configuration of the information processing apparatus according to the first embodiment.

FIG. 3 is a block diagram illustrating a functional configuration of the information processing apparatus 20. As illustrated in FIG. 3, the information processing apparatus 20 includes a display modality selection unit 101, a modality association unit 102, a conductor model parameter selection unit 103, a signal source estimation unit 104, and a signal source display unit 105.

The display modality selection unit 101, the modality association unit 102, the conductor model parameter selection unit 103, the signal source estimation unit 104, and the signal source display unit 105 may be implemented by causing the CPU 21 to read the information processing program that is stored in the ROM 23 or the auxiliary storage device 2 and execute the information processing program, may be implemented by hardware, such as an integrated circuit (IC), or may be implemented by a combination of software and hardware.

The display modality selection unit 101 functions as an image extraction unit that extracts candidate modality images (MR images) to be visualized from a data group of a single or a plurality of modality images (MR images). If a plurality of pieces of examination data (magnetoencephalography measurement data) that refer to modality images are input to the information processing apparatus 20, the display modality selection unit 101 first determines a modality image (MR image) to be displayed. This will be described in detail later.

The modality association unit 102 functions as a first association unit that associates separate modality data (magnetoencephalography measurement data) that refers to the extracted modality image, with the extracted modality image. The modality association unit 102 associates coordinate values in the three-dimensional coordinate space of the MR image with the three-dimensional coordinate space of the magnetoencephalography measurement data as indicated by Expression (1) below. Similarly, the modality association unit 102 is able to perform coordinate space transformation by defining a homogeneous transformation matrix for associating coordinate values of an analysis result of a signal source that is analyzed in the three-dimensional coordinate space of the magnetoencephalography measurement data with the three-dimensional coordinate space of the MR image.

$$\begin{bmatrix} X_{meg} \\ Y_{meg} \\ Z_{meg} \\ 1 \end{bmatrix} = \begin{bmatrix} a & b & d & e \\ f & g & h & i \\ j & k & l & m \\ 0 & 0 & 0 & 1 \end{bmatrix} \begin{bmatrix} X_{mri} \\ Y_{mri} \\ Z_{mri} \\ 1 \end{bmatrix} \quad (1)$$

As disclosed in Japanese Unexamined Patent Application Publication No. 2006-167350 for example, it is possible to calculate transformation coefficients of the homogenous transformation matrix by defining, as corresponding points, coordinates of marker coils that are attached to a subject at the time of measuring the magnetoencephalography measurement data and coordinates of markers that are attached to the subject and that can be captured in the MR image, and by solving an equation of each of the coefficients by adopting a solution of each of the corresponding points to the homogenous transformation matrix.

The conductor model parameter selection unit 103 uniquely determines an image to be visualized, on the basis of the modality image that is extracted by the display modality selection unit 101 and an association result that is obtained by the modality association unit 102. More specifically, the conductor model parameter selection unit 103 selects a parameter of a conductor model. As the conductor model, a spherical conductor model that assumes a brain as a spherical uniform conductor is frequently used.

Figure 4:
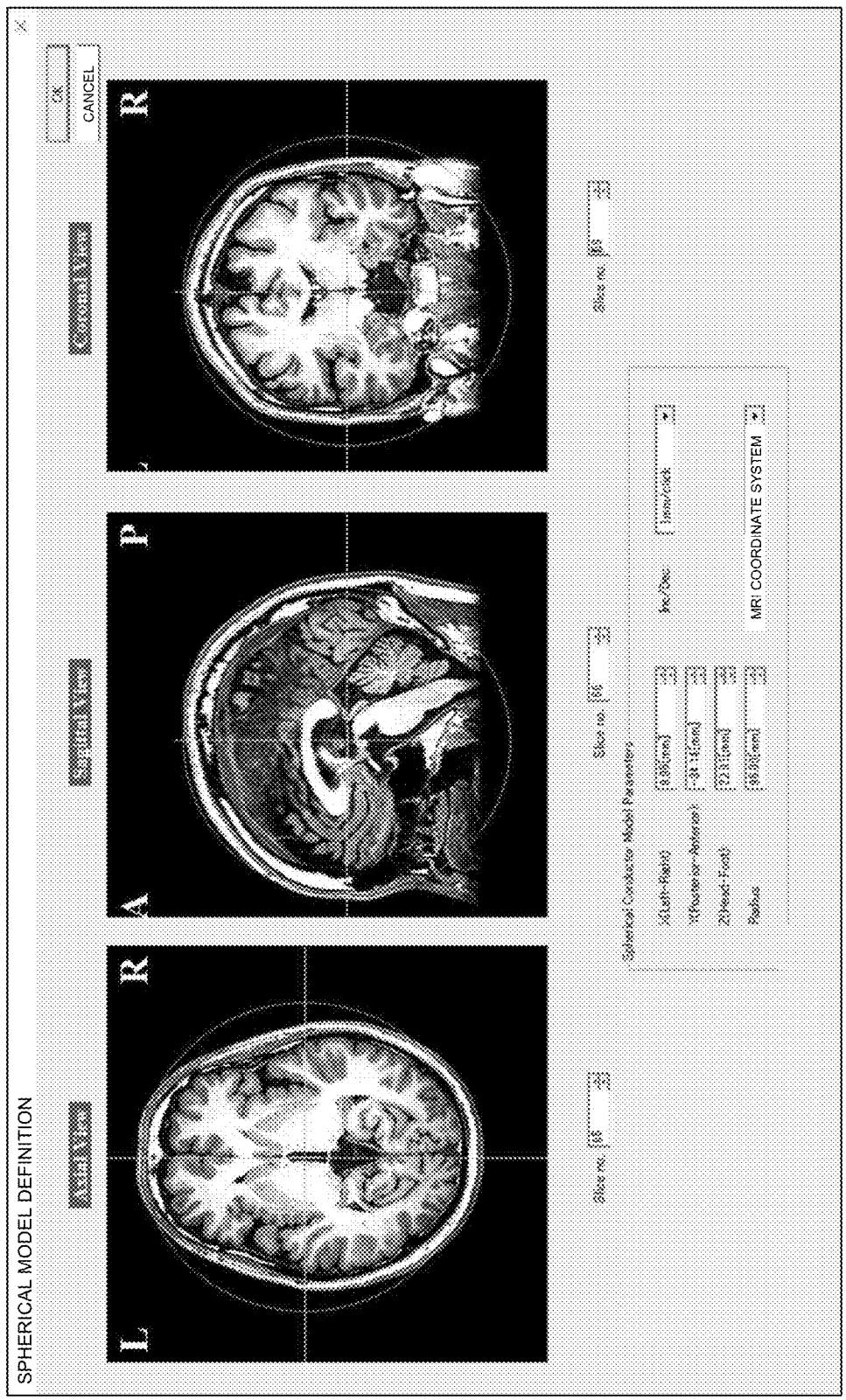
FIG. 4 is a diagram illustrating spherical model definition.

FIG. 4 is a diagram illustrating spherical model definition. As illustrated in FIG. 4, the conductor model parameter selection unit 103 is able to display a user interface and allow checking and setting of parameters of a spherical model (central coordinates and a spherical radius of a sphere in the three-dimensional coordinate space of the MR image).

If a parameter for the MR image that is selected by the display modality selection unit 101 is already determined, the conductor model parameter selection unit 103 displays a corresponding parameter value.

The signal source estimation unit 104 estimates, from the magnetoencephalography measurement data, a position, intensity, a distribution, or the like of a source of brain activities (signal source). More specifically, the signal source estimation unit 104 estimates the signal source by using a certain method, such as a dipole estimation method or a spatial filtering method. In general, the dipole estimation method assumes the number of current sources that are generated in the brain, and estimates positions (points) and intensity of the current sources from a certain single time of measured magnetic field data. The spatial filtering method estimates, instead of the points, a current density distribution and current from pieces of magnetic field data at a plurality of time points.

Meanwhile, the signal source estimation unit 104 appropriately performs, as pre-processing on waveform data of the magnetoencephalograph, bandpass filtering, base line correction for aligning waveform offset, a noise removal process, such as DSSP, or the like before estimation of the signal source.

Meanwhile, if unanalyzed examination data (magnetoencephalography measurement data) is input, the signal source estimation unit 104 estimates a signal source by a predetermined method in advance. For example, the signal source estimation unit 104 determines a time at which characteristic waveform information (IED) appears and extracts a sensor, and thereafter performs dipole estimation analysis on the basis of the time and the selected sensor information. Further, if measurement is performed by using a measurement protocol that is determined based on the premise that a specific spatial filter is applied and if reference time point information on measurement data is explicitly specified, the signal source estimation unit 104 may perform predetermined analysis, such as calculation using a spatial filtering method corresponding to an examination protocol.

The signal source display unit 105 displays a distribution or intensity of the signal source on the MR image. An example of a display method will be described below.

Figure 5:
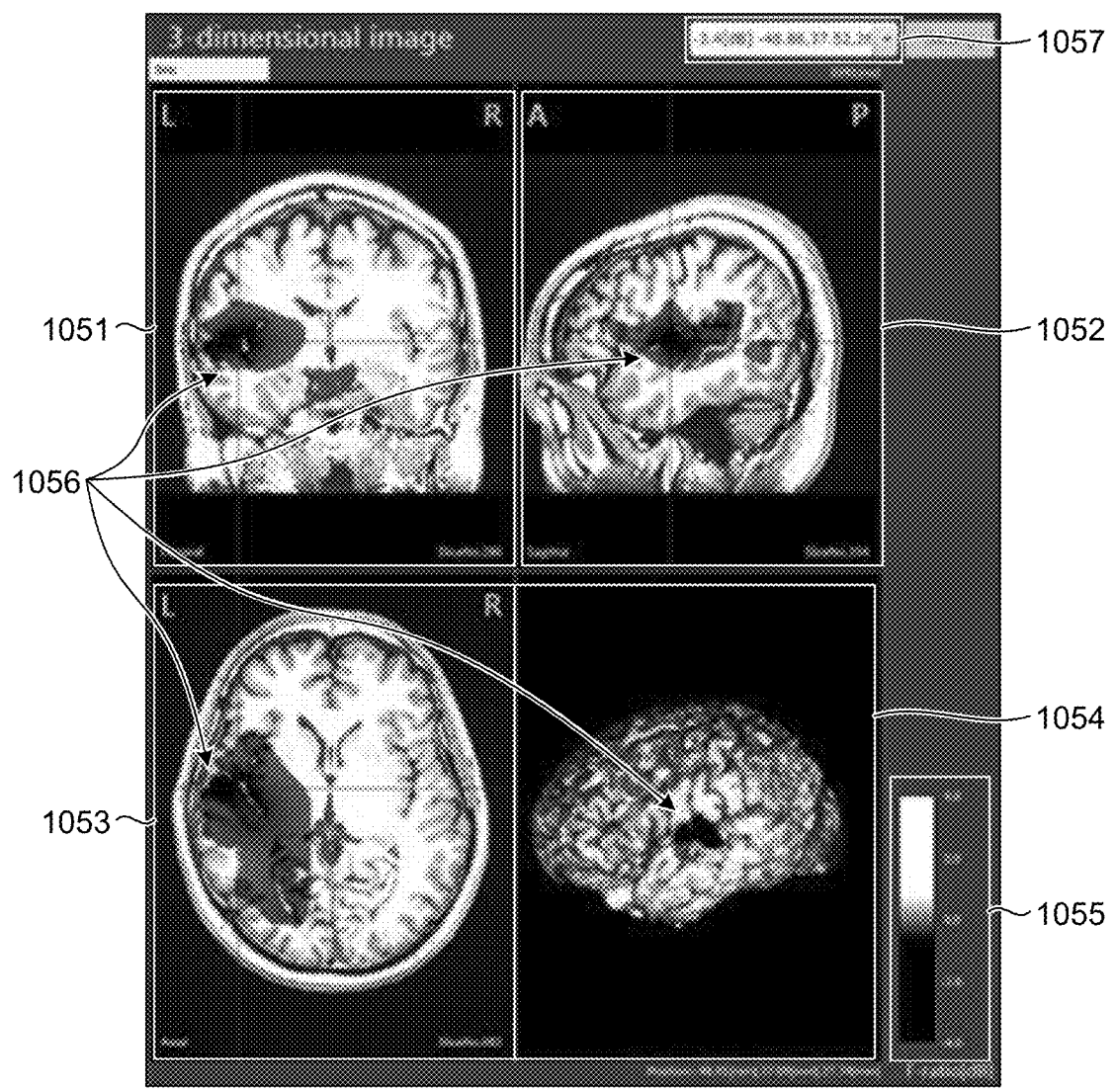
FIG. 5 is a diagram illustrating a display example using a spatial filtering method.

FIG. 5 is a diagram illustrating a display example using the spatial filtering method. FIG. 5 illustrates an example of a display result of signal intensity and a distribution using the spatial filtering method. As illustrated in FIG. 5, the signal source display unit 105 displays each of cross-sectional views (a coronal surface 1051, a sagittal surface 1052, and an axial surface 1053) of a three-dimensional MR image, and a display part 1054 in which a three-dimensional free viewpoint image of a surface of a cerebral cortex can be displayed. Further, the signal source display unit 105 displays a distribution and intensity of the signal source by shading 1056 on a brain image. Furthermore, the signal source display unit 105 displays the signal intensity corresponding to the shading in a part indicated by a reference numeral 1055. Moreover, the signal source display unit 105 displays a position and a value of a peak point corresponding to a maximum or a minimum of the signal intensity by a distribution 1057.

Figure 6:
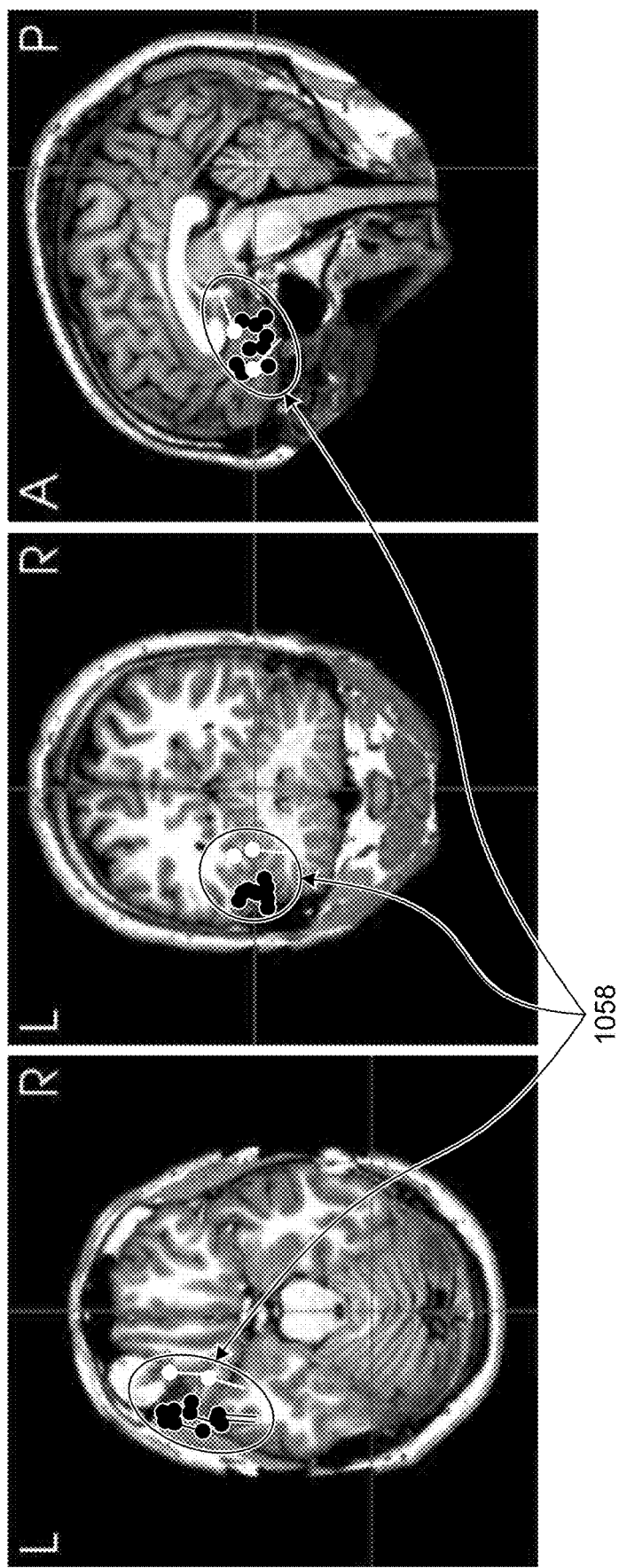
FIG. 6 is a diagram illustrating a display example using a dipole estimation method.

FIG. 6 is a diagram illustrating a display example using the dipole estimation method. FIG. 6 illustrates an example 1058 in which an estimated point and orientation of the estimated point obtained by the dipole estimation method are displayed in a three-dimensional manner. As illustrated in FIG. 6, the signal source display unit 105 assumes that, with respect to shaded dipoles, it is determined that a distance between each of the dipoles falls in a predetermined range and positions of the dipoles are located close to one another, and collectively displays the dipoles as a dipole cluster. Meanwhile, as illustrated in FIG. 6, the signal source display unit 105 displays isolated dipoles in white. In other words, the signal source display unit 105 functions as a second association unit that associates different modality data, which is modality data (magnetoencephalography measurement data) that has not been associated by the modality association unit 102, with the modality image that is extracted by the display modality selection unit 101. Further, the signal source display unit 105 functions as an image display unit that displays the different modality data on the modality image that is extracted by the display modality selection unit 101.

Figure 7:
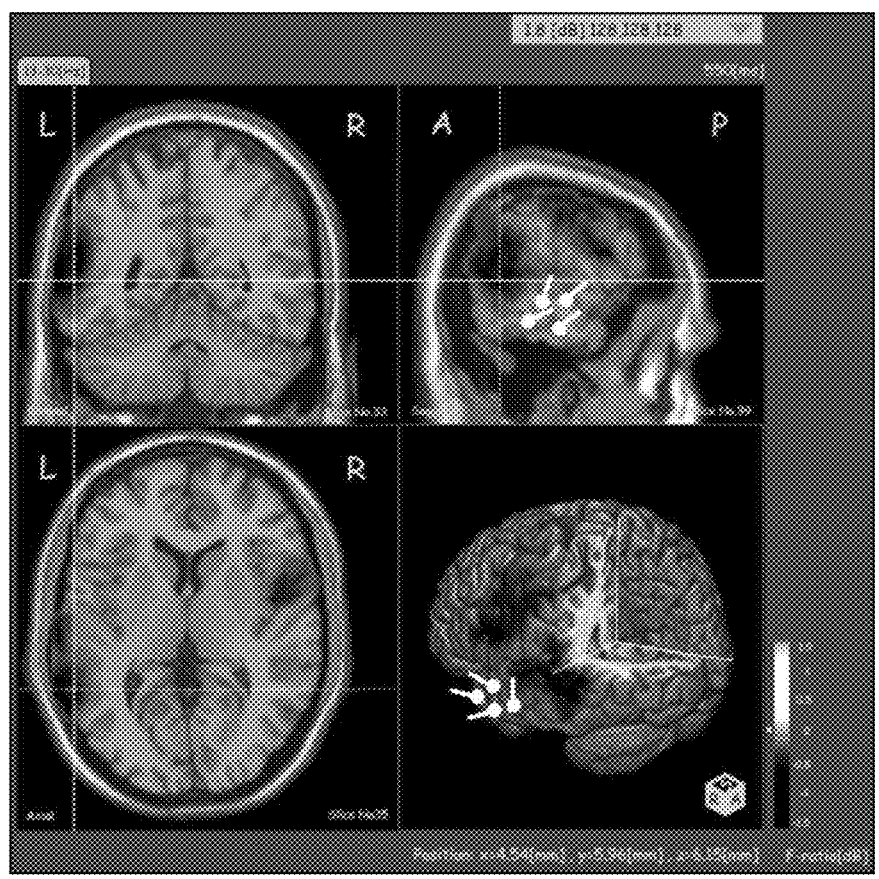
FIG. 7 is a diagram illustrating a display example of a signal source display unit.

In addition, as described above, the signal source display unit 105 is able to accurately display a statistical analysis, such as spatial filter analysis or dipole cluster analysis, without an error of positions in the MR image, by displaying a plurality of pieces of examination data (magnetoencephalography measurement data) and analysis methods in a superimposed manner. FIG. 7 is a diagram illustrating a display example of the signal source display unit 105. In the example illustrated in FIG. 7, signal source estimation results obtained by the dipole estimation and the spatial filter are displayed in a superimposed manner.

In this manner, the signal source display unit 105 displays different modality data, which is the modality data (magnetoencephalography measurement data) that has not been associated by the modality association unit 102, on the extracted modality image (MR image). The signal source display unit 105, by collectively displaying pieces of associated data, integrates analysis results of a plurality of examinations and allows visual and statistical analysis.

The display modality selection unit 101 will be described in detail below.

Figures 8, 9:
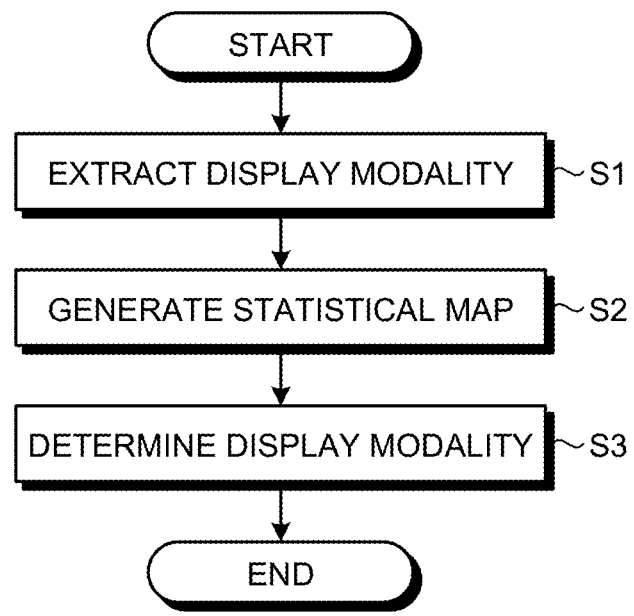
FIG. 8 is a flowchart illustrating the flow of a selection process performed by a display modality selection unit.
FIG. 9 is a diagram illustrating an example of a statistical map.

FIG. 8 is a flowchart illustrating the flow of a selection process performed by the display modality selection unit 101. As illustrated in FIG. 8, if each piece of examination data is input, the display modality selection unit 101 extracts an MR image (Step S1). Specifically, if an MR image is associated with the input examination data (magnetoencephalography measurement data), the display modality selection unit 101 extracts the MR image. Specifically, if a piece of examination data (magnetoencephalography measurement data) including an MR image is present among a plurality of pieces of examination data as a group, the display modality selection unit 101 extracts the included MR image and thereafter performs processing.

If only the magnetoencephalography measurement is performed and no MR image is associated with the input examination data (magnetoencephalography measurement data), the display modality selection unit 101 directly goes to Step S2.

Subsequently, the display modality selection unit 101 generates a statistical map (Step S2). FIG. 9 is a diagram illustrating an example of the statistical map. As illustrated in FIG. 9, the display modality selection unit 101 registers an extracted MR image in the statistical map. Meanwhile, the display modality selection unit 101 registers an identifier, such as a file name of the MR image, a path, or a DICOM-based identification ID, with which data of a specified MR image is uniquely identified. Hereinafter, the identifier will be referred to as a display modality ID as illustrated in FIG. 9.

The display modality selection unit 101 further registers information that complements the display modality ID in the statistical map. As illustrated in FIG. 9, the display modality selection unit 101 sets, as basic information for selecting the display modality ID, an item of a reference examination number of the MR image (the information that complements the display modality ID) in the statistical map. If a certain display modality ID is not registered, the display modality selection unit 101 registers the certain display modality ID in the statistical map and sets the reference examination number to '1'. Further, if the same process is performed on different examination data and the same display modality ID is selected, the display modality selection unit 101 increments the reference examination number of the corresponding display modality ID by '1'. Meanwhile, even if a plurality of MR images are referred to in a single examination, it is satisfactory to similarly register the reference examination number of each of the display modality IDs or increment the reference examination number by '1', and the number of MR images per examination is not specifically limited.

Subsequently, the display modality selection unit 101 determines an MR image from the information in the statistical map that is generated at Step S2 (Step S3). As illustrated in FIG. 9, the statistical map includes the display modality ID and the reference examination number. The display modality selection unit 101 selects the display modality ID with the largest reference examination number. Meanwhile, if display modality IDs associated with the same reference examination number are present, the display modality selection unit 101 selects the display modality ID that is registered first (or last).

In this manner, by selecting the display modality ID with a larger reference number, the display modality selection unit 101 is able to reduce the number of piece of examination data for which re-calculation for signal source estimation is needed, so that it is possible to reduce an analysis time when a large number of pieces of examination data are input.

Meanwhile, if no data is registered in the statistical map, it is indicated that there is no MR image. In this case, by giving a notice for requesting a user to reconsider the input data or by preparing data in which marker coordinates of the MR image as illustrated in FIG. 4 are defined on an MR image of a standard brain (ICBM 152, Colin 27, or the like) that is published by, for example, The McConnell Brain Imaging Centre and determining the MR image as a display modality, the display modality selection unit 101 is able to adopt the statistical map even if there is no display modality in all of examinations.

As a background in which the method as described above is extremely effective, there is a background in which automatic analysis using AI is utilized. A difficulty level of magnetoencephalography analysis is high and it takes a long time to perform the analysis. It is generally unrealistic for a doctor to exhaustively check recorded magnetoencephalography waveforms for a long time. Therefore, it is expected to first perform initial analysis of predetermined examination data and generate examined data. Further, it is expected that automatic analysis is performed on remaining examination data by using analysis parameters or setting made by the doctor. Thereafter, it is expected to implement workflow in which re-analysis or statistical analysis is effectively performed on the basis of a result of the automatic analysis, and an analysis result is used for making a diagnosis.

In this manner, according to the present embodiment, it is possible to omit signal source estimation in the magnetoencephalography measurement data (modality data for dipole analysis) corresponding to a modal modality (MR image). Therefore, it is possible to reduce a time and it is possible to quickly and integrally display dipole analysis results that are a plurality of pieces of examination data (magnetoencephalography measurement data) on a desired modality (MR image) without mismatch, even if a plurality of piece of examination data (magnetoencephalography measurement data) are collectively input.

Second Embodiment

A second embodiment will be described below.

The second embodiment is different from the first embodiment in that only dipole estimation and simple spatial filter is applied. In the description of the second embodiment below, explanation of the same components as those of the first embodiment will be omitted and differences from the first embodiment will be described.

The display modality selection unit 101 according to the second embodiment will be described in detail below.

Figure 10:
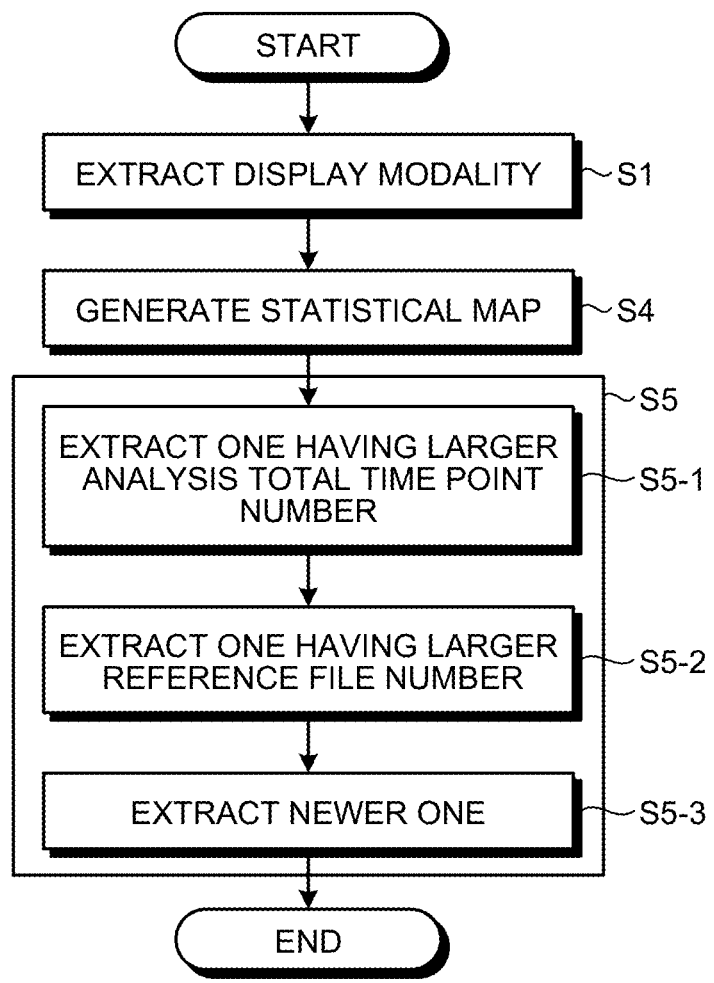
FIG. 10 is a flowchart illustrating the flow of a selection process performed by a display modality selection unit according to a second embodiment.

FIG. 10 is a flowchart illustrating the flow of a selection process performed by the display modality selection unit 101 according to the second embodiment. Step S1 illustrated in FIG. 10 is the same as explained in the first embodiment, and therefore, explanation thereof will be omitted.

The display modality selection unit 101 generates a statistical map (Step S4). FIG. 11 is a diagram illustrating an example of the statistical map. As illustrated in FIG. 11, the display modality selection unit 101 includes, in the statistical map, a display modality ID, an analysis total time point number, an analysis time point number, and a recorded data ID.

As a mode of the magnetoencephalography examination data, pieces of examination data (magnetoencephalography measurement data) are recorded over a plurality of sessions in each of examinations, and pieces of magnetic field waveform data corresponding to the number of the sessions are stored. Further, if analysis using the spatial filter is performed, a plurality of sub-sessions may be performed in each of sessions, and analysis may be performed by using averaged data of pieces of magnetoencephalography measurement data of the sub sessions. In each case, a plurality of data files to be analyzed are present for single examination, recorded data ID for identifying each of the files is assigned and managed, and signal source estimation analysis is performed on a part or all of the recorded data IDs. Meanwhile, the recorded data ID in the present embodiment has the same meaning as a unit of single analysis.

Specifically, at Step S4, the display modality selection unit 101 defines and calculates a reference data file number that indicates the number of times that each of the recorded data IDs refers to the display modality ID. Subsequently, the display modality selection unit 101 calculates the analysis time point number that indicates the number of times of reference of a waveform that is referred to when a magnetoencephalography included in the analysis data of each of the recorded data IDs is analyzed. For example, in the case of the dipole analysis, the display modality selection unit 101 calculates a single dipole for each time point of a recorded waveform. As in the example of the statistical map illustrated in FIG. 11, if data with the recorded data ID of A001 is subjected to the dipole analysis 50 times, the analysis time point number is set to 50. Further, as in the example of the statistical map illustrated in FIG. 11, when data with the recorded data ID of C001 is analyzed by a minimum-norm method of the spatial filtering method, and if waveforms of the magnetoencephalography are recorded at a sampling frequency of 2000 Hz and analyzed at an analysis interval of 0.5 second, the analysis time point number is set to 1000 time points. Meanwhile, if analysis is not performed, the display modality selection unit 101 sets the analysis time point number to zero.

Furthermore, the display modality selection unit 101 defines the analysis total time point number by grouping and summing up, for each of the display modality IDs, the analysis time point numbers that are determined for the respective recorded data IDs as described above.

As described above, the display modality selection unit 101 determines the modality image based on the analysis time. By selecting the modality image with the longest analysis time from among the modality images that are already analyzed, it is possible to reduce an analysis time taken to perform association.

Subsequently, the display modality selection unit 101 determines an MR image from the information in the statistical map that is generated at Step S4 (Step S5). At Step S5, the display modality selection unit 101 performs selection in accordance with three priorities by using the statistical map. Specifically, the display modality selection unit 101 extracts one having a larger analysis total time point number (Step S5-1), extracts one having a larger reference file number if the analysis total time point numbers are the same (Step S5-2), and selects newer one (Step S5-3). With this configuration, it is possible to determine the display modality ID that refers to an analysis file with the largest analysis time point number. Consequently, it is possible to select a modality ID by which it is possible to further reduce a time for re-calculation.

In this manner, according to the present embodiment, by selecting a modality image with the longest analysis time from among modality images that are already analyzed, it is possible to reduce an analysis time needed for association.

Meanwhile, in the second embodiment, the analysis time point number that indicates the number of times of reference of the waveform that is referred to when the magnetoencephalography is analyzed is used for the statistical map, but embodiments are not limited to this example, and it may be possible to adopt an analysis time that is needed for analyzing the magnetoencephalography.

For example, in the analysis using the spatial filtering method as described in the second embodiment, a sampling frequency and the analysis time point number contribute to a calculation time. For example, in "Sekihara K., Kumihashi I. (2010) Array-Gain Constraint Minimum-Norm Spatial Filter with Recursively Updated Gram Matrix for Biomagnetic Source Reconstruction. In: Supek S., Susac A. (eds) 17th International Conference on Biomagnetism Advances in Biomagnetism-Biomag 2010. IFMBE Proceedings, vol 28. Springer, Berlin, Heidelberg.", the minimum-norm method of the spatial filtering method is recursively applied to update calculation parameters. In this manner, by analyzing a recursive number n and multiplying a calculation time in the spatial filtering method by the recursive number to obtain an evaluation index in which an actual analysis time is taken into account, it is possible to improve estimation accuracy.

Furthermore, in analysis using a spatial filter in which time frequency analysis is used as described in "Dalal, Sarang S., et al. "Five-dimensional neuroimaging: localization of the time-frequency dynamics of cortical activity." Neuroimage 40.4 (2008): 1686-1700.", the sampling frequency and the analysis time point number contribute to a calculation time. Therefore, spatial filter calculation is repeated the same number of times as an overlap rate, which is resolution of an analysis interval of the time frequency analysis as indicated below.

analysis time division×number of frequency divisions/divided windows

Therefore, by multiplying the spatial filter calculation time by the overlap rate, it is possible to estimate an actual analysis time.

In this manner, by estimating the analysis time while taking into account the analysis time point number of the magnetoencephalography measurement data and characteristics of the selected MR image, it is possible to select a display modality ID while taking into account the calculation time. In other words, by correcting the estimation in accordance with an environment, it is possible to determine an image without an error in the estimation.

Meanwhile, if an analysis environment is the same, the estimation is the same and effective, so that the modality association unit 102 may record the analysis time in the modality data (magnetoencephalography measurement data) in advance and refer to the stored analysis time as an analysis time.

Furthermore, the modality association unit 102 may be able to perform estimation with increased accuracy by calculating an analysis time while additionally taking into account hardware information that is obtained from an OS if the apparatus is compatible with a GPU or a multi-core CPU.

Meanwhile, if an analysis environment of a plurality of pieces of examination data (magnetoencephalography measurement data) is different from the analysis environment of the embodiments in various points, a time needed for re-analysis may become unstable or may be conversely determined. To prevent a situation as described above, it is needed to re-estimate an execution time in accordance with an execution environment.

Third Embodiment

A third embodiment will be described below.

The third embodiment is different from the first embodiment and the second embodiment in that it is assumed that a conductor model using a brain region extraction of an MR image is used. In the description of the third embodiment below, explanation of the same components as those of the first embodiment and the second embodiment will be omitted and differences from the first embodiment or the second embodiment will be described.

The display modality selection unit 101 according to the third embodiment will be described in detail below.

Figure 12:
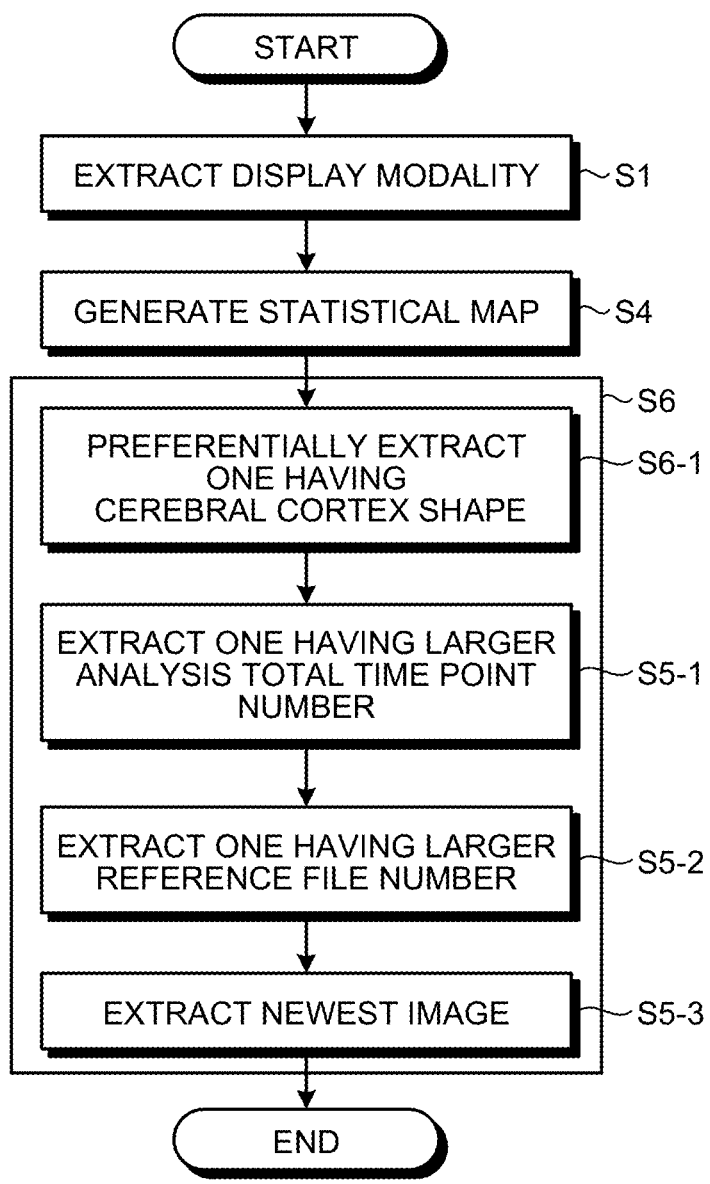
FIG. 12 is a flowchart illustrating the flow of a selection process performed by a display modality selection unit according to a third embodiment.

FIG. 12 is a flowchart illustrating the flow of a selection process performed by the display modality selection unit 101 according to the third embodiment. Step S1 and Step S4 illustrated in FIG. 12 are the same as explained in the second embodiment, and therefore, the same explanation will not be repeated.

The display modality selection unit 101 determines an MR image from the information in the statistical map that is generated at Step S4 (Step S6).

At Step S6, the display modality selection unit 101 performs selection in accordance with four priorities by using the statistical map. Specifically, the display modality selection unit 101 preferentially and automatically extracts one having a surface shape of a cerebral cortex as drawn in the display part 1054 as illustrated in FIG. 5 from MR images in advance (Step S6-1). Meanwhile, examples of the method of automatically extracting an MR image with the surface shape of the cerebral cortex includes a method as described in "FreeSurfer (Fischl et al., 2002), BrainSuite (Shattuck and Leahy, 2002), SPM (Friston et al., 2007), ANTs (Avants et al., 2009), FSL (Jenkinson et al 2012), which is based on a statistical method, and a method as described in "FastSurfer (Henschel, et al. 2020)", which is based on CNN.

Subsequently, the display modality selection unit 101 obtains an inscribed sphere that is inscribed in the surface shape of the cerebral cortex extracted at Step S6-1, and adopts central coordinates of the inscribed sphere as central coordinates of a sphere. Then, a longest distance from the center of an inscribed circle to a surface of the cerebral cortex shape is adopted as a radius. Finally, a sensor lead field in which a relationship between measurement data of a magnetoencephalography sensor and current data in the brain is formulated is calculated from the center and the radius of the sphere by using the Sarvas formula that is a spherical model, so that it becomes possible to subsequently estimate a signal source.

Furthermore, as an embodiment other than the spherical model, an overlapping spherical model as described in "Huang, M. X., John C. Mosher, and R. M. Leahy. "A sensor-weighted overlapping-sphere head model and exhaustive head model comparison for MEG." Physics in Medicine & Biology 44.2 (1999): 423.", in which an actual shape, rather than the sphere, is taken into account is known. In this method, a cerebral cortex region included in a predetermined range of each of magnetoencephalography sensors is extracted, and central coordinates and a radius of a sphere that is inscribed in the cerebral cortex region are calculated. The centers and the radii of spheres corresponding to all of the sensors are calculated, and a sensor lead field is calculated by using the Sarvas formula.

If the brain region is not automatically extracted as described in the first embodiment, it is needed to set the center and the radius of the sphere for each of the magnetoencephalography sensors, so that this method is not a realistic option, but, if the cerebral cortex is extracted, it is possible to automatically perform processing and calculation.

In addition, it may be possible to use an actual shape model, such as a boundary element method or a finite element method, using numerical approximation.

Subsequent Steps S5-1 to S5-3 are the same as those described in the second embodiment, and therefore, explanation thereof will be omitted.

With the configuration as described above, it is possible to estimate a signal source and display the signal source without a burden on a user. It may of course be possible to display, to the user, a result of the automatically-extracted spherical model or the surface shape of the cerebral cortex in the display part 1054 as illustrated in FIG. 5 and request the user to perform confirmation and specify necessity of re-setting or re-calculation of parameters.

Fourth Embodiment

A fourth embodiment will be described below.

The fourth embodiment is different from the first to the third embodiments in that analysis is performed by re-using the surface shape of the cerebral cortex included in the MR image. In the description of the fourth embodiment below, explanation of the same components as those of the first to the third embodiments will be omitted and differences from the first to the third embodiments will be described.

In the analysis configuration described in the third embodiment, it may be possible to perform analysis by assuming that the examination data includes the surface shape of the cerebral cortex in addition to the MR image and by re-using the surface shape.

FIG. 13 is a diagram illustrating an example of a statistical map according to the fourth embodiment. As illustrated in FIG. 13, the display modality selection unit 101 includes, in the statistical map, a display modality ID, a reference data file number, an analysis total time (including all processes), a signal source estimation analysis time, presence of surface shape of cerebral cortex, and a recorded data ID.

The display modality selection unit 101 defines and calculates the reference data file number that indicates the number of times that each of the recorded data iDs refers to the display modality ID.

Further, the display modality selection unit 101 calculates the analysis for signal source estimation (signal source estimation analysis time), which is needed for analysis of the magnetoencephalography and which is included in the analysis data of each of the recorded data IDs as described in the third embodiment.

Furthermore, the display modality selection unit 101 checks whether the analysis data includes shape data of the cerebral cortex. Meanwhile, the display modality selection unit 101 may set and manage an extraction time of the surface shape of the cerebral cortex, instead of the information indicating whether the analysis data includes the shape data of the cerebral cortex. In FIG. 13, the extraction time of the surface shape of the cerebral cortex is additionally described.

Moreover, the display modality selection unit 101 calculates, for each of the display modality IDs, the analysis total time (signal source estimation analysis time+(extraction time of the surface shape of the cerebral cortex)).

Here, the flow of a process performed by the display modality selection unit 101 according to the fourth embodiment will be described in detail below.

At Step S6-1 in FIG. 12 described in the third embodiment, the display modality selection unit 101 extracts only display modality IDs for each of which the surface shape of the cerebral cortex is "present", by using the statistical map as illustrated in FIG. 13. In contrast, if each of the IDs indicates that the surface shape of the cerebral cortex is "absent", the display modality selection unit 101 goes to a next step without performing the process of extracting the statistical map.

Subsequently, at Step S5-1 in FIG. 12, the display modality selection unit 101 extracts the display modality ID with the largest total analysis time. If the display modality ID is not uniquely determined at this time, the display modality selection unit 101 uniquely selects the display modality ID through Steps S5-2 and S5-3 as described in the second embodiment.

In this manner, according to the present embodiment, by selecting data with which re-calculation of the surface shape of the cerebral cortex, which takes a long time for a process, can be avoided as much as possible, it is possible to reduce a re-analysis time. Further, it is possible to reduce a re-analysis time when a magnetoencephalography examination is added at a later time. In this manner, by preferentially selecting an MR image in which the brain region is extracted, it is possible to automatically perform analysis without a burden on the user.

Meanwhile, at Step S6-1 in the fourth embodiment, if a single cerebral cortex algorithm is determined and it is possible to change only setting of a parameter that controls quality of extraction of the surface shape of the cerebral cortex, it may be possible to preferentially extract data for which a processing time for extraction of the surface shape of the cerebral cortex is long. With this configuration, only a cerebral cortex model with the highest quality is re-used, so that it is possible to improve the quality of the conductor model and save a temporal cost for re-calculation.

Fifth Embodiment

A fifth embodiment will be described below.

The fifth embodiment is different from the first to the fourth embodiments in that a combination of a conductor model and signal source estimation is made uniform for each of groups. In the description of the fifth embodiment below, explanation of the same components as those of the first to the fourth embodiments will be omitted and differences from the first to the fourth embodiments will be described.

Figure 14:
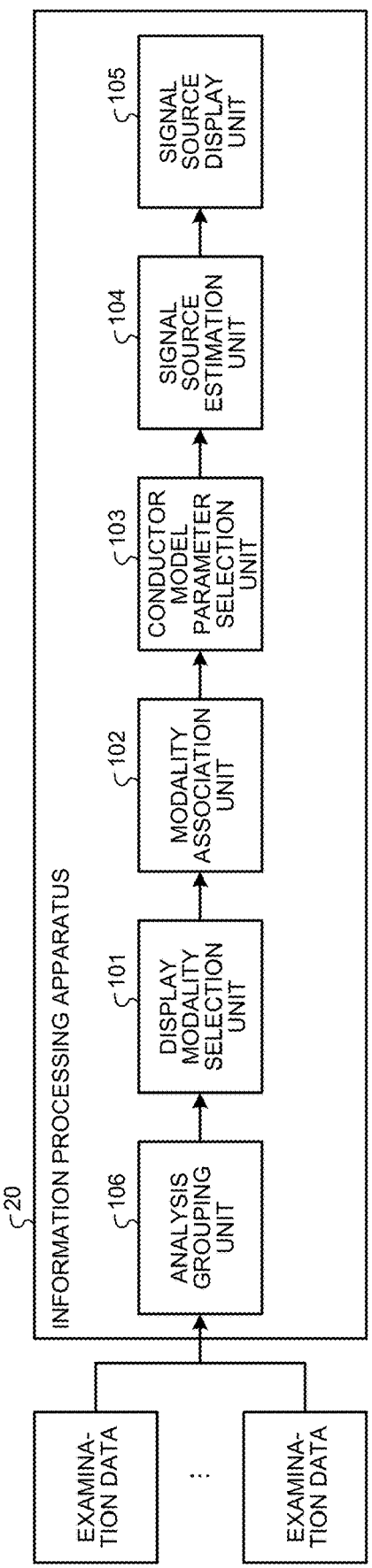
FIG. 14 is a block diagram illustrating a functional configuration of an information processing apparatus according to a fifth embodiment.

FIG. 14 is a block diagram illustrating a functional configuration of the information processing apparatus 20 according to the fifth embodiment. As illustrated in FIG. 14, the information processing apparatus 20 includes an analysis grouping unit 106 in addition to the display modality selection unit 101, the modality association unit 102, the conductor model parameter selection unit 103, the signal source estimation unit 104, and the signal source display unit 105.

The analysis grouping unit 106 performs grouping of examination data (magnetoencephalography measurement data) and an analysis method (conductor model and signal source estimation). More specifically, the analysis grouping unit 106 classifies the examination data by a modality recording method.

FIG. 15 is a diagram illustrating an example of the grouping performed by the analysis grouping unit 106. Meanwhile, it may be possible to allow a user to arbitrarily select grouping in a table format as illustrated in FIG. 15, or it may be possible to automatically perform grouping from an examination protocol.

In the example of the grouping performed by the analysis grouping unit 106 as illustrated in FIG. 15, pieces of examination data (magnetoencephalography measurement data) including only consecutive recorded data of magnetoencephalography are automatically grouped into an A group. Further, a piece of examination data (magnetoencephalography measurement data) for which a timing and a frequency are defined as an examination protocol during a predetermined period of electrical stimulation that is performed to check somatosensory evoked magnetic fields (SEF) to identify a central sulcus before operation is automatically grouped in to a B group.

Thereafter, the display modality selection unit 101 selects an MR image, the modality association unit 102 associates the modality for each of the groups on the basis of the selected MR image, the conductor model parameter selection unit 103 selects a conductor model parameter, and the signal source estimation unit 104 estimates a signal source.

Further, the signal source display unit 105 displays a signal source estimation result of each of the groups such that the spatial filter and the dipole estimation are superimposed as illustrated in FIG. 7.

In the first embodiment and the third embodiment, determination of a conductor model and estimation of a signal source with respect to unanalyzed data (magnetoencephalography measurement data) are limited to predetermined methods, but the method is not specifically limited to a single method. As in the fifth embodiment, by making a combination of the conductor model and the signal source estimation uniform for each of the groups, even if unprocessed examination data is added, it is possible to automatically execute a grouped process in accordance with the examination protocol without a burden on the user.

In this manner, according to the present embodiment, by automatically classifying data in accordance with a type of input examination data (magnetoencephalography measurement data) by setting automatic dipole analysis for epilepsy analysis and automatically analyzing the somatosensory evoked magnetic fields (SEF) using the spatial filtering method, even if the user adds unanalyzed data to the present processing process, it is possible to automatically select an appropriate analysis method, perform analysis, and simultaneously display data.

Meanwhile, in the embodiments as described above, if at least any of the functional units of the information processing system 1 is implemented by execution of a program, the program is provided by being incorporated in a ROM or the like in advance. Further, the program executed by the biological signal measuring system 1 according to the embodiments and modifications as described above may be provided by being recorded in a computer readable recording medium, such as a CD-ROM, an FD, a CD-R, or a DVD, in a computer-installable or computer-executable file format.

Furthermore, the program executed by the information processing system 1 of the embodiments as described above may be stored in a computer connected to a network, such as the Internet, and may be provided by download via the network. Moreover, the program executed by the information processing system 1 of the embodiments as described above may be provided or distributed via a network, such as the Internet.

Furthermore, the program executed by the information processing system 1 of the embodiments as described above has a module structure that includes at least any of the functional units as described above. As actual hardware, each of the functional units as described above is loaded and generated on a main storage device by causing a CPU to read the program from a ROM or the like and execute the program.

According to one embodiment of the present invention, even in a situation in which a plurality of pieces of examination data are collectively input, it is possible to quickly and integrally display the plurality of pieces of modality data on a desired modality without a mismatch.

The above-described embodiments are illustrative and do not limit the present invention. Thus, numerous additional modifications and variations are possible in light of the above teachings. For example, at least one element of different illustrative and exemplary embodiments herein may be combined with each other or substituted for each other within the scope of this disclosure and appended claims. Further, features of components of the embodiments, such as the number, the position, and the shape are not limited the embodiments and thus may be preferably set. It is therefore to be understood that within the scope of the appended claims, the disclosure of the present invention may be practiced otherwise than as specifically described herein.

The method steps, processes, or operations described herein are not to be construed as necessarily requiring their performance in the particular order discussed or illustrated, unless specifically identified as an order of performance or clearly identified through the context. It is also to be understood that additional or alternative steps may be employed.

Further, any of the above-described apparatus, devices or units can be implemented as a hardware apparatus, such as a special-purpose circuit or device, or as a hardware/software combination, such as a processor executing a software program.

Further, as described above, any one of the above-described and other methods of the present invention may be embodied in the form of a computer program stored in any kind of storage medium. Examples of storage mediums include, but are not limited to, flexible disk, hard disk, optical discs, magneto-optical discs, magnetic tapes, non-volatile memory, semiconductor memory, read-only-memory (ROM), etc.

Alternatively, any one of the above-described and other methods of the present invention may be implemented by an application specific integrated circuit (ASIC), a digital signal processor (DSP) or a field programmable gate array (FPGA), prepared by interconnecting an appropriate network of conventional component circuits or by a combination thereof with one or more conventional general purpose microprocessors or signal processors programmed accordingly.

Each of the functions of the described embodiments may be implemented by one or more processing circuits or circuitry. Processing circuitry includes a programmed processor, as a processor includes circuitry. A processing circuit also includes devices such as an application specific integrated circuit (ASIC), digital signal processor (DSP), field programmable gate array (FPGA) and conventional circuit components arranged to perform the recited functions.

What is claimed is:

1. An image processing method comprising:
   extracting a candidate modality image to be visualized from a data group of a single or a plurality of modality images;
   first associating separate modality data referring to an extracted modality image, with the extracted modality image;
   uniquely determining an image to be visualized, based on the modality image extracted at the extracting and an association result of the first associating;
   second associating different modality data being not associated at the first associating, with the modality image extracted at the extracting; and
   displaying the different modality data on the modality image extracted at the extracting.

2. The image processing method according to claim 1, wherein
   the first associating includes associating an analysis time for which analysis with modality data referring to an extracted modality image is performed in advance, with the extracted modality image, and at the determining, the image is determined based on the analysis time.

3. The image processing method according to claim 1, further comprising acquiring hardware information on a calculation device before the first associating, wherein the first associating further includes calculating an analysis time from a processing procedure with which analysis with modality data referring to an extracted modality image is performed in advance and from the hardware information acquired at the acquiring, and associating the analysis time, and at the determining, the image is determined based on the analysis time.

4. The image processing method according to claim 1, wherein the first associating includes associating a reference time point number of modality data referring to the extracted modality image, and at the determining, the image is determined based on the reference time point number.

5. The image processing method according to claim 1, wherein at the extracting, a modality image in which a surface shape of a cerebral cortex is extracted, is preferentially extracted.

6. The image processing method according to claim 1, further comprising classifying the modality data by a modality recording method, before the second associating, wherein at the second associating, the different modality data being not associated at the first associating is associated with the modality image extracted at the extracting, by a different method for each of classifications at the classifying.

7. An image processing apparatus comprising:

an image extraction unit configured to extract a candidate modality image to be visualized from a data group of a single or a plurality of modality images;

a first association unit configured to associate separate modality data referring to an extracted modality image, with the extracted modality image;

an image determination unit configured to uniquely determine an image to be visualized, based on the modality image extracted by the image extraction unit and an association result by the first association unit;

a second association unit configured to associate different modality data being not associated by the first association unit, with the modality image extracted by the image extraction unit; and an image display unit configured to display the different modality data on the modality image extracted by the image extraction unit.

8. A non-transitory computer-readable medium including programmed instructions that cause a computer to execute:

extracting a candidate modality image to be visualized from a data group of a single or a plurality of modality images;

first associating separate modality data referring to an extracted modality image, with the extracted modality image;

uniquely determining an image to be visualized, based on the modality image extracted at the extracting and an association result of the first associating;

second associating different modality data being not associated at the first associating, with the modality image extracted at the extracting; and displaying the different modality data on the modality image extracted at the extracting.

* * * * *